US011496072B2

(12) United States Patent
Wu

(10) Patent No.: US 11,496,072 B2
(45) Date of Patent: Nov. 8, 2022

(54) DEVICE AND METHOD FOR WORK FUNCTION REDUCTION AND THERMIONIC ENERGY CONVERSION

(71) Applicant: Koucheng Wu, Renton, WA (US)

(72) Inventor: Koucheng Wu, Nantou County (TW)

(73) Assignee: Koucheng Wu, Nantou (TW)

( * ) Notice: Subject to any disclaimer, the term of this patent is extended or adjusted under 35 U.S.C. 154(b) by 377 days.

(21) Appl. No.: 16/867,743

(22) Filed: May 6, 2020

(65) Prior Publication Data

US 2020/0266040 A1 Aug. 20, 2020

(51) Int. Cl.

| | |
|---|---|
| ***H02N 3/00*** | (2006.01) |
| ***H01L 29/12*** | (2006.01) |
| *H01L 31/0352* | (2006.01) |
| *H01L 29/66* | (2006.01) |

(52) U.S. Cl.

CPC ............ *H02N 3/00* (2013.01); *H01L 29/125* (2013.01); *H01L 29/66977* (2013.01); *H01L 31/035227* (2013.01); *Y10S 977/762* (2013.01)

(58) Field of Classification Search

CPC ... H02N 3/00; H01L 29/125; H01L 29/66977; H01L 31/035227; Y10S 977/762; H01J 45/00

See application file for complete search history.

(56) References Cited

U.S. PATENT DOCUMENTS

| | | | | |
|---|---|---|---|---|
| 3,515,908 A * | 6/1970 | French | H01J 45/00 | 310/306 |
| 3,932,776 A * | 1/1976 | Dunlay | G21H 1/106 | 976/DIG. 417 |
| 4,667,126 A * | 5/1987 | Fitzpatrick | H01J 45/00 | 310/306 |
| 5,654,557 A * | 8/1997 | Taneya | H01S 5/341 | 257/17 |
| 5,719,407 A * | 2/1998 | Ugajin | B82Y 10/00 | 257/17 |
| 5,953,356 A * | 9/1999 | Botez | H01S 5/3402 | 372/45.01 |
| 5,981,071 A * | 11/1999 | Cox | H01J 21/04 | 313/496 |

(Continued)

OTHER PUBLICATIONS

S. Kim, M. Y. Lee, S. Lee, and S.-H. Jhi, "Super low work function of alkali-metal-adsorbed transition metal dichalcogenides," Journal of Physics: Condensed Matter, vol. 29, No. 31, p. 315702 (8pp), 2017, doi: 10.1088/1361-648x/aa79bd.

(Continued)

*Primary Examiner* — Pedro J Cuevas

(74) *Attorney, Agent, or Firm* — SV Patent Service

(57) ABSTRACT

A quantum wire device includes a barrier formed by an insulator or a wide bandgap semiconductor, and metal quantum wires comprising a metal material and embedded in the barrier. Potential wells are formed for electrons in the metal quantum wires by the insulator or the wide bandgap semiconductor. The work function of the metal quantum wires is reduced by quantum confinement compared to a bulk form of the metal material. The metal quantum wires are electrically connected. The metal quantum wires include an exposed active area for electron emission or electron collection.

20 Claims, 4 Drawing Sheets

(56) References Cited

U.S. PATENT DOCUMENTS 5,994,638 A * 11/1999 Edelson ................. G21H 1/106 310/306
6,037,697 A * 3/2000 Begg ........................ H02N 3/00 310/306
6,064,137 A * 5/2000 Cox ......................... H02N 3/00 310/306
6,100,621 A * 8/2000 Rasor ...................... H01J 45/00 310/306
6,103,298 A * 8/2000 Edelson .................... H01J 1/30 427/78
6,117,344 A * 9/2000 Cox ........................ H01J 9/022 430/296
6,181,049 B1 * 1/2001 Streckert ................. H01J 45/00 310/306
6,281,514 B1 4/2001 Tavkhelidze
6,229,083 B1 * 5/2001 Edelson .................. H01J 45/00 310/306
6,294,858 B1 * 9/2001 King ....................... H01J 45/00 310/306
6,396,191 B1 * 5/2002 Hagelstein ............... H02N 3/00 310/306
6,495,843 B1 * 12/2002 Tavkelidze ................ H01J 1/30 257/17
6,531,703 B1 * 3/2003 Tavkhelidze ............. H01J 1/30 257/17
6,720,704 B1 * 4/2004 Tavkhelidze ............ F25B 21/00 438/141
6,936,839 B2 * 8/2005 Taylor ................. H01L 29/7785 257/187
6,946,596 B2 * 9/2005 Kucherov ............... H01J 45/00 136/238
7,122,735 B2 * 10/2006 Zuppero ............... H01L 29/155 310/311
7,457,338 B2 * 11/2008 Mawst ................ H01S 5/34313 372/45.011
7,557,487 B2 * 7/2009 Tanielian ................ H01L 35/30 310/306
7,566,897 B2 * 7/2009 Bibilashvili ...... H01L 29/66977 257/24
7,618,905 B1 * 11/2009 Eyink .................... B82Y 10/00 438/22
7,915,144 B2 * 3/2011 Tanielian ................ H01L 35/00 438/351
7,928,630 B2 * 4/2011 Walitzki .................. H01J 45/00 310/306
7,936,040 B2 * 5/2011 Wu ..................... H01L 29/0821 257/E29.178
8,258,672 B2 * 9/2012 Walitzki .................. H01J 45/00 310/306
8,330,192 B2 * 12/2012 Tavkhelidze ............ H01L 33/24 257/280
8,541,678 B2 * 9/2013 Walitzki .................. H01J 45/00 438/54
8,890,113 B2 * 11/2014 Ledentsov ............ H01L 33/305 257/14
10,050,414 B2 * 8/2018 Mathai .................... H01S 5/426
2003/0042819 A1 * 3/2003 Martinovsky ........... H01J 45/00 310/306
2004/0195934 A1 * 10/2004 Tanielian ................ H01L 35/00 310/306
2006/0162761 A1 * 7/2006 Tanielian ................ H01L 35/30 136/212
2007/0023077 A1 * 2/2007 Tanielian ................ H01J 45/00 136/201
2010/0102298 A1 * 4/2010 Wu ....................... H01L 29/152 257/E29.078
2013/0092896 A1 * 4/2013 Ledentsov .............. H01L 33/06 257/94
2015/0325419 A1 * 11/2015 Lee ......................... H01J 45/00 310/306
2018/0323362 A1 11/2018 Schewede
2019/0115520 A1 * 4/2019 Schwede ................. H01L 35/30
2019/0237313 A1 * 8/2019 Davidson ................ H01J 45/00

OTHER PUBLICATIONS

A. N. Tavkhelidze, "Nanostructured electrodes for thermionic and thermotunnel devices," Journal of Applied Physics, vol. 108, No. 4, p. 044313, Aug. 2010, doi: 10.1063/1.3464256.

* cited by examiner

DEVICE AND METHOD FOR WORK FUNCTION REDUCTION AND THERMIONIC ENERGY CONVERSION

TECHNICAL FIELD

This invention relates generally to the field of electronic devices, and more specifically, to the materials, structures, devices, and fabrication processes for reducing work function in thermionic energy conversion.

BACKGROUND OF THE INVENTION

The work function W is a material surface parameter, defined as the minimum energy that is required to remove an electron from a solid to a point in the vacuum immediately outside the solid surface. The work function can be expressed as $$W=E_{VAC}-E_F \quad (1)$$

where $E_{VAC}$ is the vacuum level and $E_F$ is the Fermi energy. The work function represents the energy barrier that prevents an electron at the Fermi level from escaping the material to free space.

Thermionic emission is a physical process that electrons in a material obtain enough kinetic energy from heat to overcome the potential barrier and escape from its surface. The thermionic current density J is given by the Richardson-Dushman equation $$J=AT^2e^{-W/kT} \quad (2)$$

where A is the Richardson constant, T is the absolute temperature, and k is the Boltzmann constant. It can be seen from this equation that the work function is a critical parameter in the thermionic emission process. A lower work function allows electron emission at a lower temperature.

Thermionic energy conversion (TEC) is the direct conversion of heat into electricity by the mechanism of thermionic emission. A thermionic energy converter consists of two electrodes: a hot emitter and a cooler collector, separated by a vacuum gap. A fraction of the electrons in the emitter have sufficient thermal energy to overcome the work function, escape from the emitter, travel across the inter-electrode space, and are collected by the collector, generating an electron current between the two electrodes.

The maximum output voltage $V_{OUT}$ that can be achieved for a thermionic converter is the difference between the emitter work function $W_E$ and the collector work function $W_C$ $$qV_{OUT}=W_E-W_C. \quad (3)$$

In order to maximize the efficiency, a large work function difference should be attained and both work functions should be low. As a rule of thumb, $W_E$ is about 1 eV larger than $W_C$, and the optimal $W_C$ is approximately $T_C/700$ (eV), where $T_C$ (° K) is the collector temperature. In practice, most thermionic converters have used cesium adsorbed tungsten electrodes with work functions on the order of 2.8 eV for the emitter and 1.7 eV for the collector. Traditional thermionic converters could have competitive efficiencies only operated at very high temperatures in the range of 1600-2000° K. The lack of materials with lower work functions and the associated high operating temperatures were the main challenges for thermionic converters in the past, which result in high cost and limited applicability of these devices.

TEC offers remarkable advantages due to its compactness, no moving mechanical parts, low maintenance, high power density, silent operation, long operational lifespan, and clean energy generation. However, most heat sources available for energy conversion have temperatures below the operating temperatures of traditional thermionic converters. The work functions of electrode materials must be reduced in order to lower the operating temperature and improve the efficiency. The existing methods for work function reduction are described below.

The traditional method of lowering a work function is by cesium adsorption. Alkali metals are the most electropositive elements in nature. When alkali metal atoms fall onto a substrate surface, their valence electrons tend to transfer to the substrate surface. A dipole moment is created between the positive adatom ions and the negative surface image charges. It has been found that the surface dipole density is directly proportional to the work function reduction. The work function of tungsten (~4.5 eV) can be reduced to ~1.6 eV by cesium adsorption, and further to ~1 eV by the co-adsorption of cesium and oxygen.

In addition to the surface adsorption, alkali metals can be included into materials with layered structures by intercalation. Examples of such layered structures include graphene, carbon nanotubes, and transition metal dichalcogenides. The charge transfer from alkali metals to host materials creates a surface dipole moment that reduces the work function. The lowest work function that has been reported to date is 0.8 eV, which is achieved by the intercalation of potassium on $WTe_2$.

The work function can also be tuned by shifting the Fermi level or the electron affinity of a material. Some wide bandgap semiconductors such as diamond have been shown to exhibit a negative electron affinity (NEA), in which the vacuum level is below the conduction band minimum. In this case, electrons excited into the conduction band could be emitted from the surface into vacuum without any barrier. When the diamond surface is hydrogen-terminated, the charge transfer between the hydrogen adatoms and carbon atoms creates a surface dipole and changes the relative position of the vacuum level. The negative electron affinity in conjunction with suitable donors can give rise to a lower work function. For example, work functions of 1.3 eV with nitrogen-doped and 0.9 eV with phosphorus-doped n-type diamonds have been reported.

Another method to reduce the work function is by means of quantum interference. If a thin metal layer has periodic indents on the surface and the indent depth is equal to one quarter of the de Broglie wavelength of the electron, the de Broglie waves interfere destructively and the number of quantum states is reduced. As a result, the Fermi level is increased and the work function is reduced.

Despite all the previous efforts to reduce the work functions of electron emitters, there are still no suitable electrode materials with work functions low enough for thermionic energy converters to operate efficiently at lower temperatures.

SUMMARY OF INVENTION

In light of the unfulfilled needs as described above, the present invention provides cost-effective electrode devices with low work functions so that thermionic energy converters can efficiently recover the thermal energy of medium-grade waste heat, for example, from internal combustion engines.

The details of one or more embodiments are set forth in the accompanying drawing and in the description below. Other features, objects, and advantages of the invention will become apparent from the description and drawings, and from the claims. In one general aspect, the present invention relates to a quantum wire device that include a barrier formed by an insulator or a wide bandgap semiconductor; and a plurality of metal quantum wires comprising a metal material and embedded in the barrier, wherein potential wells can be formed for electrons in the metal quantum wires by the insulator or the wide bandgap semiconductor, wherein work function of the metal quantum wires is reduced by quantum confinement compared to a bulk form of the metal material, wherein the plurality of metal quantum wires can be electrically connected, wherein the plurality of metal quantum wires can include an exposed active area for electron emission or electron collection.

Implementations of the system may include one or more of the following. The plurality of metal quantum wires can be formed by an alkali metal. The plurality of metal quantum wires can be substantially parallel to each other. The plurality of metal quantum wires can have widths smaller than 1 nm. The plurality of metal quantum wires can have lengths shorter than 500 Å. The plurality of metal quantum wires can include first ends that are electrically connected, wherein the plurality of metal quantum wires include second ends comprising the exposed active area. The insulator can include silicon dioxide, silicon nitride, or aluminum oxide. The wide bandgap semiconductor can have a negative electron affinity. The wide bandgap semiconductor can include diamond, silicon carbide, or $Al_xGa_{1-x}N$ alloys. The barrier can be made of a crystalline material, wherein the metal quantum wires are formed by metal ions implanted along open channels in the crystalline material. The crystalline material can have a diamond cubic lattice structure, wherein the open channel direction is a <110> direction in the diamond cubic lattice structure. The barrier can be formed by a non-crystalline insulator, wherein the metal quantum wires can be formed by metal ions of the metal material in empty spaces within the non-crystalline insulator.

In another general aspect, the present invention relates to thermionic energy converter that includes an emitter electrode; a collector electrode, wherein at least one of the emitter electrode or the collector electrode comprises: a barrier; metal quantum wires comprising a metal material embedded in the barrier, wherein the barrier forms potential wells for electrons in the metal quantum wires, wherein the metal quantum wires can be electrically connected, wherein the metal quantum wires can include an exposed active area for electron emission or electron collection; and an electric circuit electrically connected the emitter electrode and the collector electrode, wherein the electric circuit can conduct an electron current from the collector electrode to the emitter electrode.

Implementations of the system may include one or more of the following. The emitter electrode can include: a first barrier; a first group of metal quantum wires comprising a metal material embedded in the first barrier, wherein the first barrier forms potential wells for electrons in the first group of metal quantum wires, wherein the first group of metal quantum wires can be electrically connected, wherein the first group of metal quantum wires can include a first exposed active area for electron emission. The collector electrode can include: a second barrier; a second group of metal quantum wires comprising a metal material embedded in the second barrier, wherein the second barrier forms potential wells for electrons in the second group of metal quantum wires, wherein the second group of metal quantum wires are electrically connected, wherein the second group of metal quantum wires can include a second exposed active area for electron collection. The electric circuit can be electrically connected the first group of metal quantum wires in the emitter electrode and the second group of metal quantum wires in the collector electrode, wherein the electric circuit is configured to conduct an electron current formed by electrons transmitted from the first active area in the emitter electrode to the second active area in the collector electrode. The emitter electrode can have a work function in the range of 0.7-1.4 eV, wherein the emitter electrode can be held at a temperature in a range of 500-1000° K. The collector electrode can have a work function in the range of 0.4-0.7 eV, wherein the collector electrode can be held at a temperature in a range of 300-500° K. The metal quantum wires can include first ends that are electrically connected and second ends comprising the exposed active area. The barrier can be made of a crystalline material, wherein the metal quantum wires are formed by metal ions implanted along open channels in the crystalline material. The barrier can be formed by a non-crystalline insulator, wherein the metal quantum wires are formed by metal ions of the metal material in empty spaces within the non-crystalline insulator. The barrier can be formed by an insulator or a wide bandgap semiconductor, wherein the metal quantum wires metal quantum wires are formed by an alkali metal.

The disclosed device and method can include one or more of the following advantages over conventional techniques. The presently disclosed quantum wire device has the following beneficial properties: low work function, high electrical conductivity, and good thermal stability. The quantum wire devices can be used as the emitter and collector electrodes of thermionic energy converters to recover the thermal energy of medium-grade waste heat. The quantum wire device includes metal quantum wires embedded in an insulator or a wide bandgap semiconductor. The work function of the metal quantum wires is reduced by quantum confinement. If the barrier material has a small or even negative electron affinity, the work function can be further reduced. The metal quantum wires are very thin, about the size of a single atom, so the quantum confinement effect is significant. The quantum wires are made of metals, which are highly electrically conductive. The metal quantum wires are electrically connected and have exposed areas for electron emission or collection.

The disclosed quantum wire device is distinctly different from any conventional electrode devices. The presently disclosed electrode devices utilize quantum confinement effect to lower the work function in a material, which is absent in conventional electrode devices. The conventional electrode devices do not have work functions low enough for thermionic energy converters to harness the thermal energy of medium-grade waste heat.

BRIEF DESCRIPTION OF THE DRAWINGS

The accompanying drawing, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
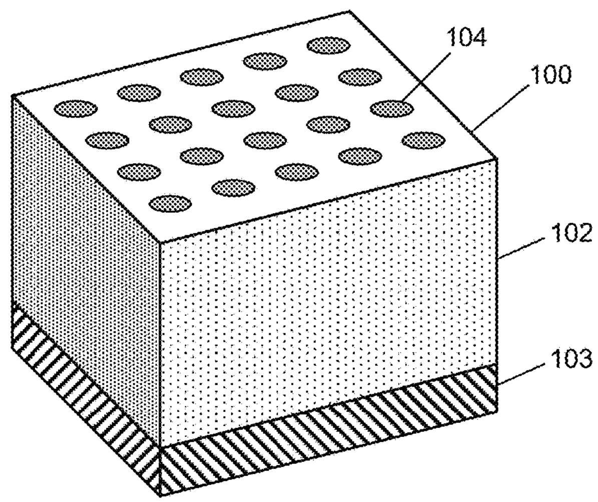
FIG. 1*a* shows a quantum wire device including metal quantum wires embedded in an insulator in accordance with some embodiments of the present invention.
Figure 1B:
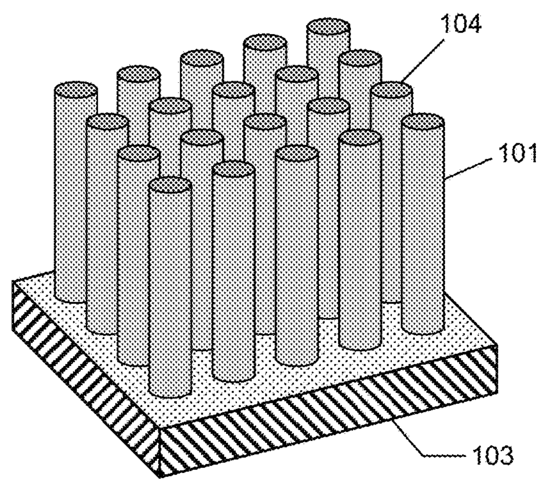
FIG. 1*b* shows the quantum wire structure of FIG. 1*a* with the insulator removed for a better view.

The working principle of this invention is based on the quantum confinement effect. Since the work function is the difference between the vacuum level and the Fermi level, the work function will be reduced when the Fermi level is increased by quantum confinement. FIG. 1*a* shows a quantum wire device 100 in some embodiments of this invention. The quantum wire device comprises of multiple metal quantum wires 101 embedded in a barrier 102. The barrier 102 is removed in FIG. 1*b* for a better view of the quantum wires 101. The metal quantum wires 101 can be formed by alkali metals, which have the lowest work functions in nature. The barrier 102 can be formed by an insulator (such as silicon dioxide $SiO_2$, silicon nitride $Si_3N_4$, and aluminum oxide $Al_2O_3$) or a wide bandgap semiconductor (such as diamond C, silicon carbide SiC, and aluminum gallium nitride $Al_xGa_{1-x}N$ alloys). The thickness of the barrier 102 is generally less than 500 Å. The barrier 102 presents a potential barrier to electron movement, so the electrons of metal quantum wires are confined in a potential well. In some embodiments, as described below, the metal quantum wires 101 can be parallel to each other. Further, the metal quantum wires 101 can be periodically distributed in the plane transverse to the lengthwise direction of the metal quantum wires 101. In some embodiments, as described below, the metal quantum wires 101 can have irregular shapes. The widths of the metal quantum wires 101 can be about the size of a single atom, which are generally smaller than 1 nm. The work function of metal quantum wires is therefore reduced by quantum confinement. In some embodiments, the metal quantum wires 101 can be approximately perpendicular to the barrier 102. Thus, the lengths of the metal quantum wires 101 are generally shorter than 500 Å. The metal quantum wires 101 are standing on a metal plate 103, so all the bottom ends of the metal quantum wires 101 are electrically connected. The top ends of the metal quantum wires 101 in FIG. 1*a* are exposed active surfaces that are not covered by the barrier 102. The exposed areas are the active areas 104 for electron emission or collection. The quantum wire device of this invention has a unique structure, which is different from conventional quantum structures. The disclosed quantum wire device can meet the requirements of (1) low work functions, (2) high electrical conductivity, and (3) good thermal stability, which is suitable for the electrodes in thermionic energy converters.

Figure 2:
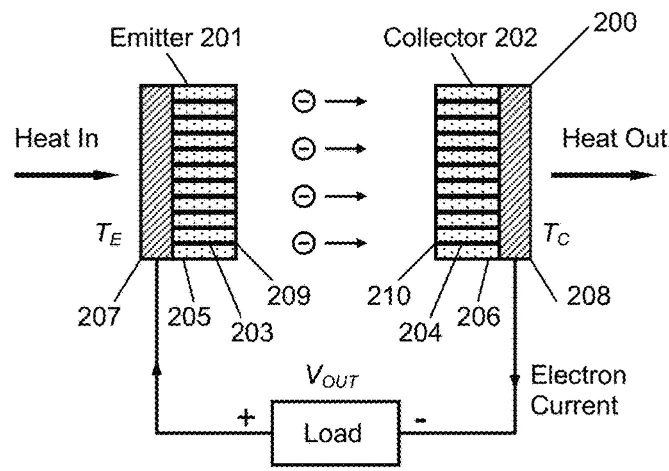
FIG. 2 is a system diagram for a thermionic converter in accordance with some embodiments of the present invention.

FIG. 2 shows the schematic drawing of a thermionic energy converter 200, which has the quantum wire devices of this invention as the emitter electrode 201 and the collector electrode 202. The emitter electrode 201 and the collector electrode 202 respectively comprise multiple metal quantum wires 203-204 embedded in barriers 205-206. All the metal quantum wires 203 of the emitter electrode 201 are electrically connected to each other by jointly connecting to a metal plate 207. All the metal quantum wires 204 of the collector electrode 202 are electrically connected to each other by jointly connecting to a metal plate 208. The exposed areas 209 of the metal quantum wires 203 are the active areas 209 of the emitter electrode 201, which are facing to the collector electrode 202. The exposed areas 210 of the metal quantum wires 204 are the active areas 210 of the collector electrode 202, which are facing to the emitter electrode 201. The emitter electrode 201 and collector electrode 202 are separated from each other by a small space in vacuum. When heat is applied to the emitter electrode 201, the emitter temperature $T_E$ rises. Some electrons have sufficient energy to overcome the work function $W_E$, escape from the emitter electrode 201, move across the inter-electrode space, and are collected by the collector electrode 202. The electrons return to the emitter electrode 201 through an external load. Thus, the energy difference between the Fermi levels of the two electrodes 201-202 is converted into electric power in the load. The low work function $W_E$ created by the disclosed metal quantum wires 203 in the emitter electrode 201 enable more electrons to have sufficient energy to overcome the work function $W_E$ and emit from the emitter electrode 201. The low work function $W_C$ created by the disclosed metal quantum wires 204 in the collector electrode 202 helps to convert more energy from the collected electrons into electric power.

Other details about the emitter electrode 201 and collector electrode 202, the associated respective barriers, and the metal quantum wires 203, 204 embedded therein are described above in relation to FIGS. 1*a* and 1*b* and below in FIGS. 3 to 13.

The operation mechanism of the disclosed devices is described in the following paragraphs. Then, two exemplary quantum wire devices are used to illustrate the quantum confinement method and the fabrication of the disclosed quantum wire devices. Low work functions generally facilitate electron emission. The collector and emitter of a thermionic energy converter are required to have low work functions in order to recover the thermal energy in the waste heat of internal combustion engines. The two exemplary devices are designed to achieve low work functions for the collector and emitter electrodes. In the first exemplary device, quantum wires made of a metal are embedded in a wide bandgap semiconductor with a negative electron affinity. In the second exemplary device, quantum wires made of a metal are embedded in an insulator with a large bandgap.

Figure 3:
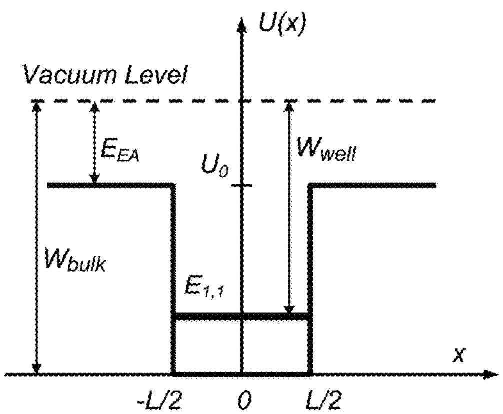
FIG. 3 shows the potential energy profile of a 2-D rectangular potential well in the x direction.

According to quantum mechanics, a particle can only have discrete energy values inside a quantum well. The ground state energy, which has the lowest energy level, is above zero. That means the Fermi level is lifted up by quantum confinement. Take an example of a single one-dimensional (1-D) metal quantum wire embedded in an insulator. The insulator presents a potential barrier to electron movements. The electron of the metal quantum wire is trapped in a two-dimensional (2-D) potential well formed by the insulator. Assume the quantum wire extends along the z direction, and the potential well is symmetric in x and y directions. FIG. 3 shows the potential energy profile of a rectangular potential well in the x direction. L is the size of the potential well. The work function of the metal that forms the quantum wire is denoted as $W_{bulk}$ in the bulk, and $W_{well}$ in the well. The ground state energy is denoted as $E_{1,1}$ (i.e., $n_x=1$ and $n_y=1$). The potential energy is zero inside the well and $U_0$ outside the well. $U_0$ is the difference between the bulk work function $W_{bulk}$ of the metal and the electron affinity E of the barrier:

$$U_0=W_{bulk}-E_{EA}. \tag{4}$$

Figure 4:
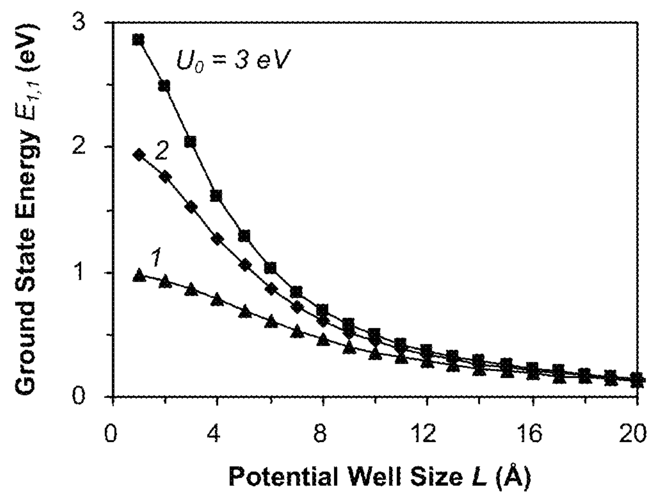
FIG. 4 shows the ground state energy $E_{1,1}$ as a function of the potential well size L for three different potential barrier heights.

The energy states of an electron confined to a 2-D potential well can be obtained by solving the time-independent Schrodinger equation below $$-\frac{\eta^2}{2m}\left(\frac{\partial^2\psi(x,y)}{\partial x^2}+\frac{\partial^2\psi(x,y)}{\partial y^2}\right)+U(x,y)\psi(x,y)=E\psi(x,y) \tag{5}$$

where $\psi(x,y)$ is the wave function, U(x,y) is the potential energy, and E is the total energy. FIG. 4 shows the ground state energy $E_{1,1}$ as a function of the potential well size L for $U_0$=3, 2, and 1 eV. It can be seen that $E_{1,1}$ increases when L is reduced, and $E_{1,1}$ is higher for a larger potential barrier $U_0$. The effect of Fermi level elevation becomes significant when the well size is very small, for example, below 1 nm (=10 Å).

The work function in the potential well, $W_{well}$, can be expressed as $$W_{well}=U_0-E_{1,1}+E_{EA}=W_{bulk}-E_{1,1}. \tag{6}$$

Figure 5:
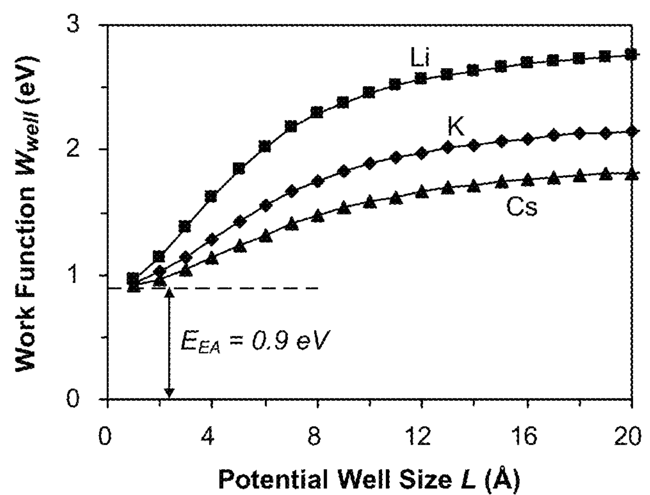
FIG. 5 shows the well work function $W_{well}$ as a function of the potential well size L for three alkali metals of Li, K, and Cs.

FIG. 5 shows the well work function $W_{well}$ as a function of the potential well size L for three alkali metals, i.e. Li, K, and Cs. Alkali metals are chosen because they have the lowest work functions in nature. The bulk work functions $W_{bulk}$ are 2.9, 2.29, and 1.95 eV for Li, K, and Cs, respectively. When the potential well size L is reduced, the ground state energy $E_{1,1}$ increases and the well work function $W_{well}$ decreases. FIG. 5 shows that the work function is reduced by the quantum confinement effect.

Figure 6:
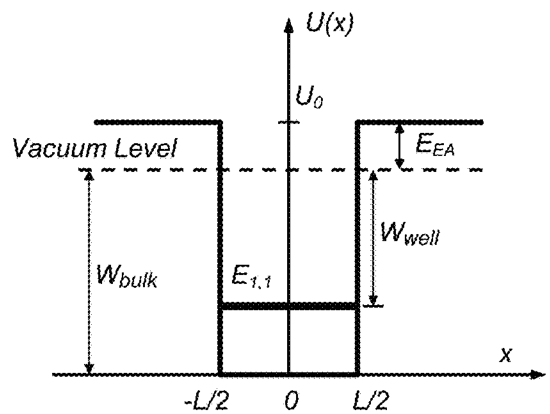
FIG. 6 shows a potential energy profile of a 2-D rectangular potential well in the x direction, in which the barrier has a negative electron affinity.
Figure 7:
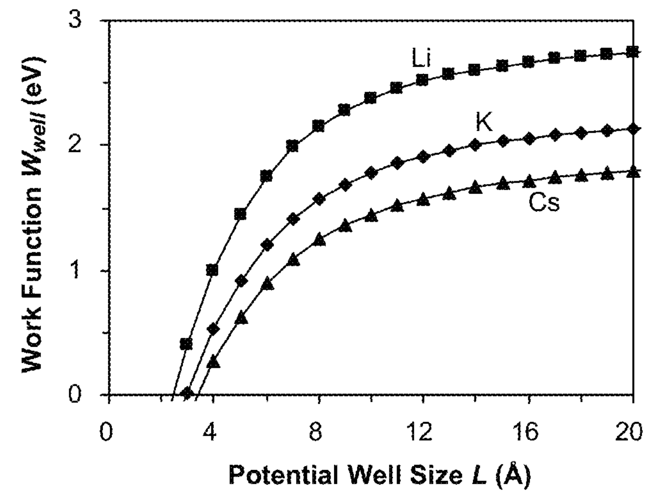
FIG. 7 shows the well work function $W_{well}$ as a function of the potential well size L for three alkali metals of Li, K, and Cs, in which the barrier has a negative electron affinity of −1.3 eV.

The barrier material in FIG. 5 is silicon dioxide $SiO_2$ with an electron affinity of 0.9 eV. It can be seen in FIG. 5 that the minimum work function that can be reduced is limited by the barrier's electron affinity. If the barrier has a smaller or even a negative electron affinity, a lower work function can be obtained. FIG. 6 shows the potential energy profile of a potential well, in which the barrier has a negative electron affinity (i.e., $E_{EA}<0$ eV). FIG. 7 shows the well work function $W_{well}$ as a function of the potential well size L for three alkali metals (i.e., Li, K, and Cs), in which the barrier has a negative electron affinity of −1.3 eV. The well work function $W_{well}$ decreases when the well size L is reduced. Theoretically, $W_{well}$ can be reduced to very small or even negative if the barrier has a small or negative electron affinity.

Figure 8:
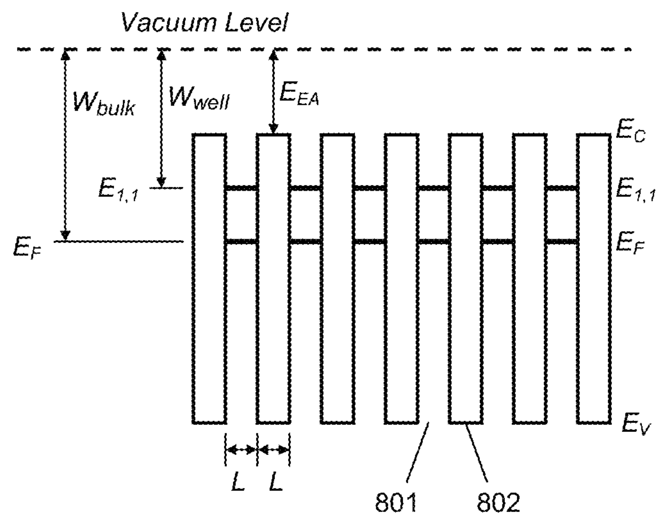
FIG. 8 shows the energy band diagram of an array of metal quantum wires embedded in an insulator.
Figure 9:
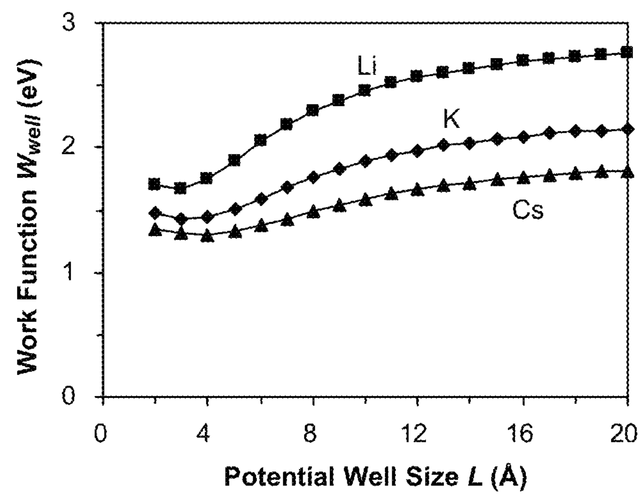
FIG. 9 shows the well work function $W_{well}$ as a function of the potential well size L for three alkali metals of Li, K, and Cs in a superlattice structure.

It has been shown that the work function of a metal can be reduced by quantum confinement for a single metal quantum wire embedded in an insulator. FIG. 8 shows the energy band diagram of a periodic array of metal quantum wires embedded in an insulator, which is the case of FIG. 1. The periodic structure of metal 801 and insulator 802 in FIG. 8 can be considered as a superlattice. The electrons of metal 801 are confined in a periodic potential well formed by the insulator 802. Assume the potential well and the barrier have the same size of L. FIG. 9 shows the well work function $W_{well}$ as a function of the potential well size (or the barrier size) L for three alkali metals (i.e., Li, K, and Cs) in the superlattice structure. When the potential well size L changes from 20 Å to 4 Å, the well work function $W_{well}$ is reduced by quantum confinement, which is similar to FIG. 5. However, when the barrier size is very small (e.g., smaller than 3 Å), the quantum confinement becomes less effective. $W_{well}$ reaches its minimal when the barrier size is about 3 Å. $W_{well}$ even starts to rise if the barrier size is further reduced to below 3 Å.

One severe drawback of the conventional thermionic energy converters is that they are required to operate at very high temperatures. Waste heat can be roughly categorized based on the heat source temperature: high-grade (>950° K), medium-grade (~500-950° K), and low-grade (<500° K). The conventional technologies are not capable of efficiently recovering the waste heat at lower temperatures to electricity. However, the waste heat sources at lower temperatures contain more amount of energy in total than the waste heat sources at higher temperatures. For example, the heat produced by internal combustion engines represents the single most important source of the waste heat. There is only about 25% of the fuel combustion energy is utilized for vehicle operation, while about 40% of the fuel energy is lost in the form of waste heat in exhaust gas. The temperature of the exhaust gas is in the range of 300-700° C. It would be very beneficial to global economy and environment if thermionic energy converters can efficiently recover the waste heat from internal combustion engines. For a thermionic energy converter to operate efficiently in the temperature range of 500-1000° K, the emitter work function $W_E$ needs to be in the range of 0.7-1.4 eV.

A thermionic energy converter is a heat engine that converts heat into electricity. Its maximum theoretical (ideal) energy conversion efficiency is limited by the Carnot efficiency $\eta_{max}$, which is given by the equation below $$\eta_{max} = \frac{T_{HOT} - T_{COLD}}{T_{HOT}} \quad (7)$$

where $T_{HOT}$ and $T_{COLD}$ are the temperatures of the hot and cold reservoirs. The efficiency is increased by either raising $T_{HOT}$ or lowering $T_{COLD}$. It can be seen from above equation that lowering $T_{COLD}$ is more effective than raising $T_{HOT}$ in order to increase the efficiency. If the reject heat temperature (i.e., collector temperature $T_C$) is in the temperature range of 300-500° K, the optimal collector work function $W_C$ would be in the range of 0.4-0.7 eV according to the rule of thumb before (i.e., $W_C \approx T_C/700$). However, such a low work function is currently not available by using the conventional state-of-art technologies.

The First Exemplary Device

Figure 10A:
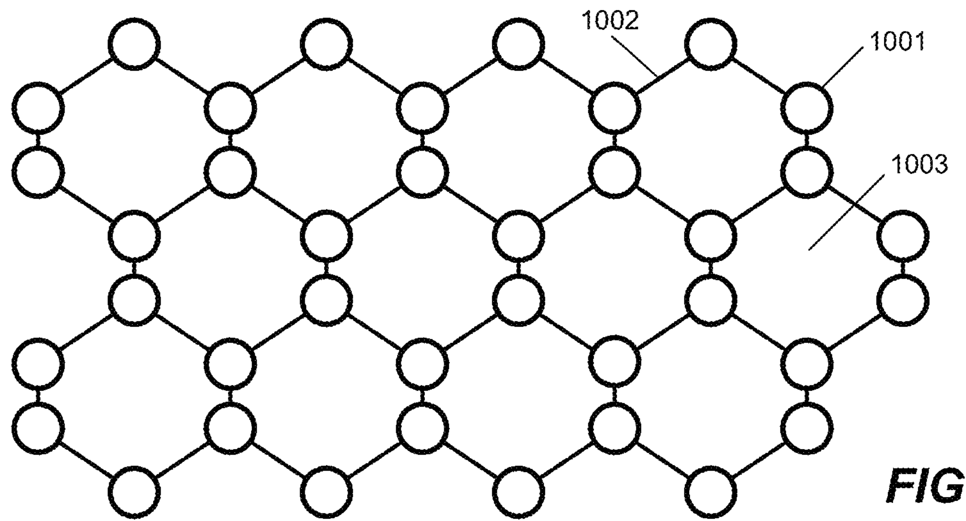
FIG. 10*a* shows the diamond lattice structure viewed in the <110> direction.
Figure 10B:
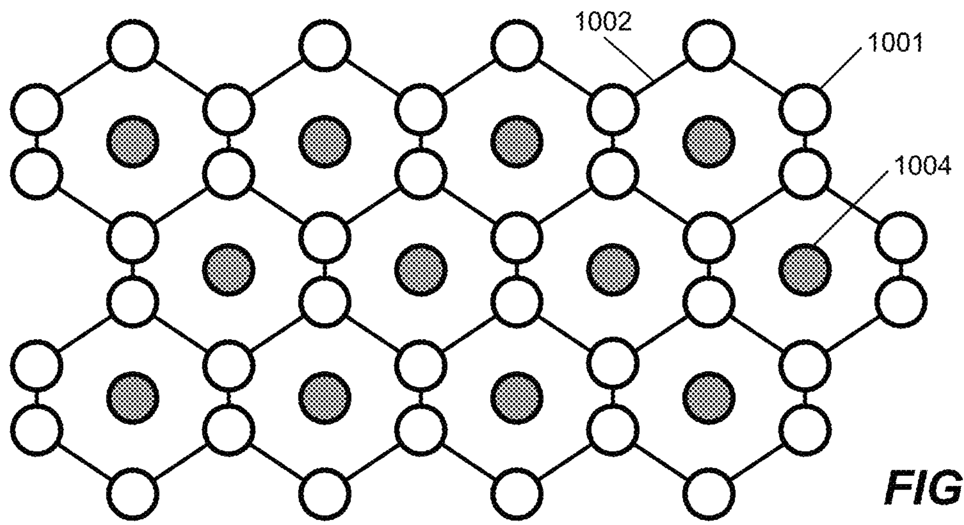
FIG. 10*b* shows the same diamond lattice structure after ion implantation.

The first exemplary device is designed to provide a low work function in the range of 0.4-0.7 eV for the collector electrode to operate in the temperature range of 300-500° K. In this device, metal quantum wires are embedded in diamond with a negative electron affinity. The diamond cubic crystal structure is a very open structure with an atomic packing factor of 0.34. FIG. 10*a* shows the diamond lattice structure viewed in the <110> direction. A honeycomb structure formed by carbon atoms 1001 can be seen. The honeycomb structure has an array of hexagonal hollow cells 1002. Each cell has a large opening at the center. The opening forms an open channel 1003 in the ion implantation process. If ions of light elements are implanted along the open channel direction, the ions will be steered along such open channels 1003 without encountering any target nuclei. The implant range can be much longer than other directions. This effect is called ion channeling. It is an undesirable effect for most semiconductor processes. However, this unfavorable ion channeling effect can be used to create quantum wires of atomic size. FIG. 10*b* shows the diamond lattice structure viewed in the <110> direction after ion implantation. Metal atoms 1004 are embedded in the open channels 1003 as shown in FIG. 10*b*. A quantum wire is formed when the metal atoms 1004 in an open channel 1003 are continuously distributed and electrically connected.

Significant advance has been made in recent years to grow single crystal diamond films on non-diamond substrates by chemical vapor deposition (CVD). Iridium has emerged as an exceptional substrate material for diamond nucleation and growth. Because Ir is a rare and expensive material, bulk Ir substrate is not an option for large-area diamond growth. Silicon is a very cost-effective substrate material, and large area wafers are readily available. Moreover, Si has a better fit of the thermal expansion coefficient with diamond. Heteroepitaxial growth of Ir on Si requires the insertion of a buffer layer to avoid them to form iridium silicides, which possess different crystal structures. $SrTiO_3$ and yttria-stabilized zirconia (YSZ) are suitable candidates for the buffer layer. The growth of high-quality epitaxial diamond films has been reported on Ir/$SrTiO_3$/Si(001) and Ir/YSZ/Si with both (001) and (111) orientations.

Figure 11:
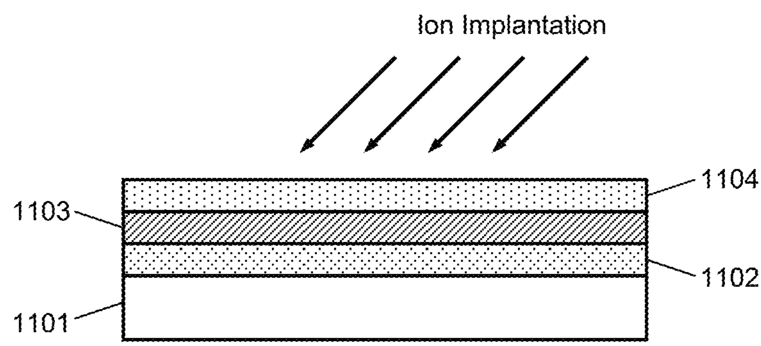
FIG. 11 shows a layer structure for fabricating a first exemplary quantum wire device.

FIG. 11 shows the layer structure for fabricating the first exemplary quantum wire device. The starting material is a Si (001) wafer 1101. A buffer layer 1102 of $SrTiO_3$ or YSZ with a thickness of about 40 nm is epitaxially grown on the Si wafer. An Ir layer 1103 with a thickness of about 150 nm is deposited by e-beam evaporation. A method called bias-enhanced nucleation (BEN) is used to induce diamond nucleation on the Ir surface. A negative bias in the range of −250 to −300 V is applied to the substrate in a microwave plasma chemical vapor deposition (MPCVD) reactor. Positive ions (e.g. $CH_3^+$) are extracted from the plasma and accelerated to the substrate by the electric field. The ion bombardment induces the nucleus formation. After the BEN treatment, CVD diamond growth continues. Tiny oriented diamond islands are merged to form a continuous single crystal layer 1104. Ions of metals with small atomic sizes and low work functions such as Li are implanted to the diamond along the <110> direction. After ion implantation, metal atoms 1004 are embedded in the open channels 1003 as shown in FIG. 10*b*, and form metal quantum wires. The wires are electrically connected to the Ir layer 1103. The diamond layer 1104 is required to be very thin, for example, 10 nm or less, so that the metal atoms are continuous in the open channels 1003. It is possible that the thin diamond layer 1104 is still in the stage of dispersed grains before forming a continuous layer. The implant damages to the diamond lattice at the surface are removed by chemical etch. The wafer is then exposed to hydrogen plasma in a MPCVD reactor. The dangling bonds at diamond surface become hydrogen-terminated and the electron affinity is changed to negative.

The Second Exemplary Device

The second exemplary device is designed to provide a low work function (in the range of 0.7-1.4 eV) for the emitter electrode to operate in the temperature range of 500-1000° K. In this device, quantum wires are embedded in a non-crystalline insulator. $SiO_2$ is a suitable insulator because it has a wide bandgap of 9 eV and the potential barrier $U_0$ is large. Thermal oxidation of silicon results in vitreous $SiO_2$ films that do not exhibit long-range order but have a high degree of short-range order. The basic structure unit of $SiO_2$ molecule is a tetrahedra cell ($SiO_4^{4-}$) with one silicon atom located at the center and four oxygen atoms at the corners. Two tetrahedra cells are then joined to each other by a common oxygen atom called a bridging oxygen, which is the case for crystalline $SiO_2$. In vitreous $SiO_2$, some of the vertices of the tetrahedral have non-bridging oxygen atoms. The bond angle Si—O—Si is nominally about 145°, but it can vary between 100° and 180° with minimal change in bond energy. Furthermore, rotation of the bond about the axis is almost free. Because of the flexibility in the bridge bonds, the $SiO_2$ molecule can be described as a continuous random network of tetrahedra cells.

The random order structure tends to be very open, i.e. having a large fraction of empty space between atoms. Channels exist through which small positive ions such as $Na^+$ and $K^+$ can readily migrate. Alkali metals such as Na and K often exist as positive ions in $SiO_2$. These ions can move under the influence of electric fields even at room temperature. The migration of mobile ions in the gate oxides of MOS transistors can cause reliability issues such as threshold voltage shift. It has been reported that $Na^+$ ions are more mobile than $K^+$ ions, and the mobility difference between $Na^+$ and $Li^+$ ions is not significant. A limit is reached somewhere between the ion radii of $K^+$ and $Rb^+$, above which ion drift in oxide is impossible.

Figure 12:
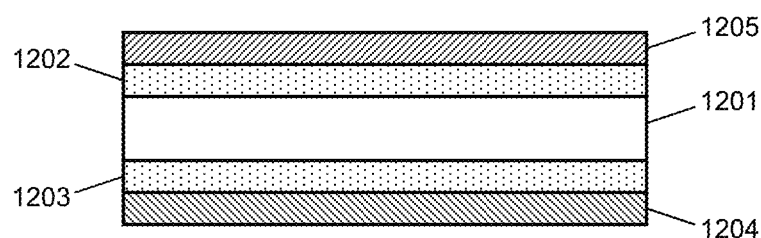
FIG. 12 shows a layer structure for fabricating a second exemplary quantum wire device.

The layer structure shown in FIG. 12 is used to explain the fabrication process of the second exemplary quantum wire device. The starting material is an n-type Si (001) wafer 1201 with double side polishing. The wafer is then put in an oxidation furnace to grow thermal oxide on both sides of the wafer in pure oxygen at 1000° C. Silicon dioxide layers 1202 and 1203 with a thickness of about 120 Å are grown on the top and bottom surfaces of the wafer, respectively. A metal layer 1204 of aluminum is deposited on the backside of the wafer. An alkali metal layer 1205 is deposited on the front side of the wafer.

A negative bias is applied to the back metal layer 1204 to attract positive metal ions from the front metal layer 1205. Alkali metal ions migrate through the front oxide layer 1202 and accumulate at the $SiO_2$/Si interface because metal ions such as $Na^+$ and $K^+$ cannot penetrate the silicon lattice. When metal ions drift through the oxide and fill the empty space in the oxide, metal wires of atomic size are formed. Because of the random molecule structure of $SiO_2$, the metal quantum wires can have irregular shapes. The diameters of metal wires are about the size of one metal atom. Since $Rb^+$ cannot drift in oxide, the size of empty space only allows metal ions smaller than $Rb^+$ to drift through.

Figure 13:
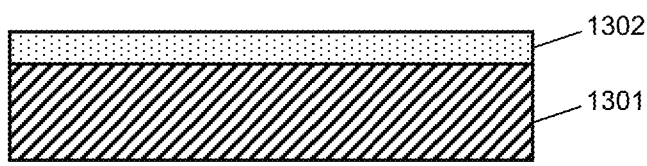
FIG. 13 shows the final layer structure of the second exemplary quantum wire device.

The front and back metal layers (1205 and 1204) are then removed by chemical etch. A thick metal layer (labeled as 1301 in FIG. 13) of tungsten is deposited on the front oxide layer 1202 (labeled as 1302 in FIG. 13). Tungsten is suitable for high temperature applications because of its high melting point. The back oxide layer 1203 and the silicon wafer 1201 are removed by chemical etch. The final structure is shown in FIG. 13, which is flipped over from the structure in FIG. 12. The quantum wires embedded in the oxide layer 1302 are electrically connected to the tungsten metal layer 1301.

The presently disclosed quantum wire device can have the following beneficial properties of (1) low work function, (2) high electrical conductivity, and (3) good thermal stability. The quantum wire devices can be used as the electrodes (both emitter and collector electrodes, or one of them) of thermionic energy converters to recover the thermal energy of medium-grade waste heat. The quantum wire device comprises of a plurality of metal quantum wires embedded in an insulator or a wide bandgap semiconductor. The work function of the metal quantum wires is reduced by quantum confinement. If the barrier material has a small or even negative electron affinity, the work function can be further reduced. The metal quantum wires are very thin, about the size of a single atom, so the quantum confinement effect is significant. The quantum wires are made of metals, which are highly electrically conductive. The metal quantum wires are electrically connected and have exposed areas for electron emission or collection.

The quantum wire device of this invention is distinctly different from any conventional electrode devices. The presently disclosed electrode devices utilize quantum confinement effect to lower the work function in a material, which is absent in conventional electrode devices. None of the conventional electrode devices have work functions low enough for thermionic energy converters to harness the thermal energy of medium-grade waste heat.

Furthermore, the methods for work function reduction are different for thermionic emission and field emission. In field emission, a strong electric field reduces the potential barrier (i.e., work function) and enhances electron emission. Field emission is therefore called "cold emission". Field emission is dependent of the electric field strength and the emitter's surface curvature. It has been reported that the electron emission is enhanced at the tips of SiC nanowires, carbon nanotubes, and other structures with sharp tips. The widths of their nanowires are generally about tens of nanometers, which are much larger than the sizes for quantum confinement (i.e., less than 1 nm). Moreover, in thermionic emission, there is no strong electric field to reduce the potential barrier.

What is claimed is:

1. A quantum wire device, comprising:

a barrier formed by an insulator or a wide bandgap semiconductor; and a plurality of metal quantum wires comprising a metal material and embedded in the barrier, wherein potential wells are formed for electrons in the metal quantum wires by the insulator or the wide bandgap semiconductor, wherein work function of the metal quantum wires is reduced by quantum confinement compared to a bulk form of the metal material, wherein the plurality of metal quantum wires are electrically connected, wherein the plurality of metal quantum wires include an exposed active area for electron emission or electron collection.

2. The quantum wire device of claim 1, wherein the plurality of metal quantum wires are formed by an alkali metal.

3. The quantum wire device of claim 1, wherein the plurality of metal quantum wires are substantially parallel to each other.

4. The quantum wire device of claim 1, wherein the plurality of metal quantum wires have widths smaller than 1 nm.

5. The quantum wire device of claim 1, wherein the plurality of metal quantum wires have lengths shorter than 500 Å.

6. The quantum wire device of claim 1, wherein the plurality of metal quantum wires include first ends that are electrically connected, wherein the plurality of metal quantum wires include second ends comprising the exposed active area.

7. The quantum wire device of claim 1, wherein the insulator includes silicon dioxide, silicon nitride, or aluminum oxide.

8. The quantum wire device of claim 1, wherein the wide bandgap semiconductor has a negative electron affinity.

9. The quantum wire device of claim 1, wherein the wide bandgap semiconductor includes diamond, silicon carbide, or $Al_xGa_{1-x}N$ alloys.

10. The quantum wire device of claim 1, wherein the barrier is made of a crystalline material, wherein the metal quantum wires are formed by metal ions implanted along open channels in the crystalline material.

11. The quantum wire device of claim 10, wherein the crystalline material has a diamond cubic lattice structure, wherein the open channel direction is a <110> direction in the diamond cubic lattice structure.

12. The quantum wire device of claim 1, wherein the barrier is formed by a non-crystalline insulator, wherein the metal quantum wires are formed by metal ions of the metal material in empty spaces within the non-crystalline insulator.

13. A thermionic energy converter, comprising:

an emitter electrode;

a collector electrode, wherein at least one of the emitter electrode or the collector electrode comprises: a barrier; metal quantum wires comprising a metal material embedded in the barrier, wherein the barrier forms potential wells for electrons in the metal quantum wires, wherein the metal quantum wires are electrically connected, wherein the metal quantum wires include an exposed active area for electron emission or electron collection; and an electric circuit electrically connected the emitter electrode and the collector electrode, wherein the electric circuit is configured to conduct an electron current from the collector electrode to the emitter electrode.

14. The thermionic energy converter of claim 13, wherein the emitter electrode comprises:

a first barrier;

a first group of metal quantum wires comprising a metal material embedded in the first barrier, wherein the first barrier forms potential wells for electrons in the first group of metal quantum wires, wherein the first group of metal quantum wires are electrically connected, wherein the first group of metal quantum wires include a first exposed active area for electron emission;

wherein the collector electrode comprises:

a second barrier;

a second group of metal quantum wires comprising a metal material embedded in the second barrier, wherein the second barrier forms potential wells for electrons in the second group of metal quantum wires, wherein the second group of metal quantum wires are electrically connected, wherein the second group of metal quantum wires include a second exposed active area for electron collection, wherein the electric circuit is electrically connected the first group of metal quantum wires in the emitter electrode and the second group of metal quantum wires in the collector electrode, wherein the electric circuit is configured to conduct an electron current formed by electrons transmitted from the first active area in the emitter electrode to the second active area in the collector electrode.

15. The thermionic energy converter of claim 14, wherein the emitter electrode has a work function in the range of 0.7-1.4 eV, wherein the emitter electrode is held at a temperature in a range of 500-1000° K.

16. The thermionic energy converter of claim 14, wherein the collector electrode has a work function in the range of 0.4-0.7 eV, wherein the collector electrode is held at a temperature in a range of 300-500° K.

17. The thermionic energy converter of claim 13, wherein the metal quantum wires include first ends that are electrically connected and second ends comprising the exposed active area.

18. The thermionic energy converter of claim 13, wherein the barrier is made of a crystalline material, wherein the metal quantum wires are formed by metal ions implanted along open channels in the crystalline material.

19. The thermionic energy converter of claim 13, wherein the barrier is formed by a non-crystalline insulator, wherein the metal quantum wires are formed by metal ions of the metal material in empty spaces within the non-crystalline insulator.

20. The thermionic energy converter of claim 13, wherein the barrier is formed by an insulator or a wide bandgap semiconductor, wherein the metal quantum wires metal quantum wires are formed by an alkali metal.

* * * * *